US006587066B1

United States Patent
Somayajula

(10) Patent No.: US 6,587,066 B1
(45) Date of Patent: Jul. 1, 2003

(54) CIRCUITS AND METHODS FOR SAMPLING AN INPUT SIGNAL IN A CHARGE REDISTRIBUTION DIGITAL TO ANALOG CONVERTER

(75) Inventor: Shyam S Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/052,607

(22) Filed: Jan. 18, 2002

(51) Int. Cl.[7] .................. G08C 19/12; H03M 1/12; H03M 1/10
(52) U.S. Cl. .................. 341/172; 341/155; 341/120
(58) Field of Search .................. 341/172, 162, 341/120, 118, 150, 156, 167, 164, 144, 155

(56) References Cited

U.S. PATENT DOCUMENTS

| | | | |
|---|---|---|---|
| 4,399,426 A | * 8/1983 | Tan | 340/347 |
| 4,764,750 A | * 8/1988 | Kawada | 340/347 |
| 4,799,042 A | * 1/1989 | Confalonieri et al. | 341/118 |
| 4,831,381 A | * 5/1989 | Hester | 341/172 |
| 4,908,624 A | * 3/1990 | Goto et al. | 341/172 |
| 4,982,194 A | * 1/1991 | Bacrania et al. | 341/172 |
| 5,006,853 A | * 4/1991 | Kiriaki et al. | 341/156 |
| 5,166,687 A | * 11/1992 | Yung | 341/172 |
| 5,258,761 A | * 11/1993 | Fotouhi et al. | 341/172 |
| 5,369,407 A | * 11/1994 | Yung et al. | 341/172 |
| 5,434,569 A | * 7/1995 | Yung et al. | 341/172 |
| 5,581,252 A | * 12/1996 | Thomas | 341/144 |
| 5,684,487 A | * 11/1997 | Timko | 341/172 |

* cited by examiner

*Primary Examiner*—N. Le
*Assistant Examiner*—Wasseem H. Hamdan
(74) *Attorney, Agent, or Firm*—James J. Murphy, Esq.; Winstead Sechrest & Minick, P.C.

(57) ABSTRACT

A method and a circuit of performing an analog to digital conversion in a charge redistribution circuit including a capacitor array of weighted capacitors and a transistor track switch for sampling an input signal into the capacitor array. A common mode voltage is stepped to a voltage sufficient to turn on the transistor track switch during a sampling phase. During the sampling phase, a top plate of each of the capacitors is coupled to the common mode voltage through the track switch while the bottom plate of each of the capacitors is coupled to an input to sample an input signal. During a conversion phase, the top plate of each of the capacitors is decoupled from the common mode voltage and the bottom plates of a selected one of the weighted capacitors is coupled to a first reference voltage, a weight of the selected one of the weighted capacitors proportional to the step in the common mode voltage. The bottom plates of the remaining capacitors are coupled to a second reference voltage and the top plate of the weighted capacitors compared against a comparison voltage proportional to the step in the common mode voltage. If the top plate voltage is above the comparison voltage, then the selected capacitor is coupled to a second reference voltage.

15 Claims, 2 Drawing Sheets

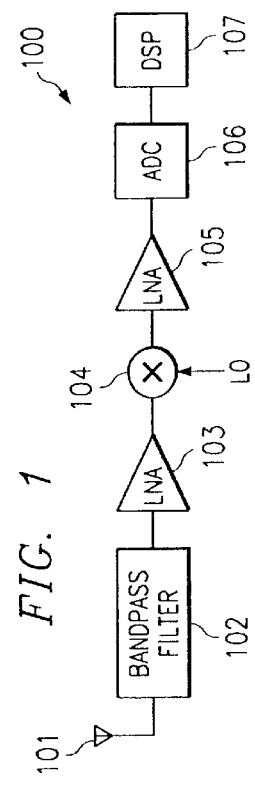

US 6,587,066 B1

CIRCUITS AND METHODS FOR SAMPLING AN INPUT SIGNAL IN A CHARGE REDISTRIBUTION DIGITAL TO ANALOG CONVERTER

FIELD OF INVENTION

The present invention relates in general to switched-capacitor circuits and methods and in particular to circuits and methods for sampling an input signal in a charge redistribution based analog to digital converter.

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital most significant bit (MSB) is coupled to a reference voltage while the bottom plates of the remaining capacitors in the array are coupled to ground or a second reference voltage (ground will be assumed here). The new top plate voltage appears at the input of the comparator and is compared against the comparison voltage. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converges to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and calibration of the DAC.

SUMMARY OF INVENTION

In switched-capacitor charge redistribution analog to digital converters, a small track switch on-resistance is desirable to achieve a large sampling bandwidth. According to the inventive principles, these track switches operate from an increased common mode voltage which in turn maximizes the turn-on voltage across the track switches thereby lowering their on-resistance. A trade-off is then made by inserting additional cycles during the comparison phase of the charge redistribution process to insure that the top plates voltage of the sampling capacitors does not go above the supply voltage or below ground to preserve charge.

BRIEF DESCRIPTION OF DRAWINGS

For a more complete understanding of the present invention, and the advantages thereof, reference is now made to the following descriptions taken in conjunction with the accompanying drawings, in which:

FIG. 1 is a high level block diagram of a digital receiver suitable for describing the principles of the present invention;

FIG. 2 is a high level functional block diagram of a single-chip analog to digital converter suitable for describing the present inventive concepts;

FIG. 3 is a more detailed functional block diagram of the capacitor array and associated switches for a selected one of the differential signal paths shown in FIG. 2.

DETAILED DESCRIPTION OF THE INVENTION

Figure 4A:
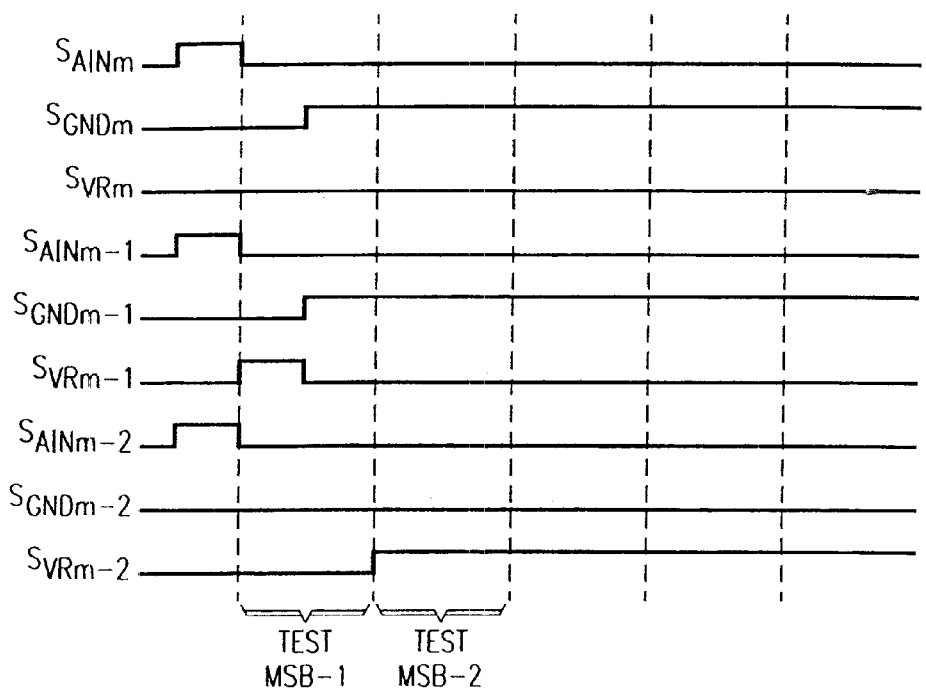
FIGS. 4A and 4B are timing diagrams illustrating exemplary bit-cycling operations with a stepped-up common mode voltage according to the principles of the present invention.

The principles of the present invention and their advantages are best understood by referring to the illustrated embodiment depicted in FIGS. 1–4B of the drawings, in which like numbers designate like parts.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

In system 100, analog to digital conversion is performed using analog to digital converter (ADC) 200 discussed in detail below. Once converted into the digital domain, the received data can be processed using a digital signal processor (DSP) subsystem 106.

FIG. 2 is a high level functional block diagram of an analog to digital converter 200 suitable for describing the present inventive concepts. A/D converter 200 is based on a successive approximation algorithm implemented by charge redistribution. Each of the differential data paths is associated with a capacitor array 201$a,b$ under control of switching circuitry 202$a,b$. During the sampling phase, capacitor arrays 201$a,b$ sample the voltages at the differential inputs $A_{IN+}$ and $A_{IN-}$. As the successive approximation algorithm successively switches the capacitors between a reference voltage and ground, during the subsequent conversion phase as discussed below, the resulting voltages at the differential inputs to comparator 203 are compared. Successive approximation register (SAR) return path 204$a,b$ then determines whether a bit is kept (i.e. the corresponding capacitor remains coupled to the reference voltage) or not kept (i.e. the corresponding capacitor is recoupled to ground).

One exemplary input capacitor array 201 is shown in further detail in FIG. 3 and includes a termination capacitor $C_T$ of capacitance C and an array of capacitors $C_{INi}$, i=1 to m and graduated in capacitance in the sequence C, 2C, 4C, ... $2^{m-2}$C, $2^{m-1}$C(ff). Capacitor $C_M$ represents the MSB and has a bit weight of ½ relative to the total capacitance capacitor $C_{M-1}$ represents the next most significant bit (MSB-1) and has a bit weight of ¼ relative to the total capacitance, and so on, with Capacitor $C_1$ representing the LSB and having a bit weight of $½^m$.

In the following discussion, input capacitors 201a coupled to the positive comparator input are designated $C_{INPi}$ and those (201b) coupled to the negative comparator input designated $C_{INNi}$. Generally, the termination capacitors participate in the sampling phase but not the bit-cycling process and therefore are coupled to Gnd during the conversion phase.

The bottom plate of each capacitor in array 201 is associated with a set of switches 301, one of which is shown in further detail (collectively, these switches are shown as arrays 203a,b in FIG. 2). Specifically, each input array switch set 301 includes a switch $S_{AINi}$ for coupling the bottom plate to the corresponding analog input voltage $A_{IN+}$ or $A_{IN-}$, a switch $S_{VRI+}$ for coupling it to the positive reference voltage rail $V_{REF+}$, a switch $S_{GNDi}$ for coupling it to the negative reference rail $V_{REF-}$, in this case GND, and a switch $S_{CMi}$ for coupling the bottom plate to the input common mode voltage $V_{CMI}$ referenced to the differential inputs $A_{IN+}$ and $A_{IN-}$. Sampling is effectuated with track switch $S_{TRACK}$ 302 which couple the top plates of capacitors 201a,b to common mode voltage $V_{CMI}$.

Capacitor arrays 201a and 201b are fully complementary differential arrays. In the following discussion, "complementary" sets of capacitors are those coupled by the appropriate switches at a given instant to opposing reference voltages during the conversion phase. For example, if capacitor $C_{INPi}$ in input array 201a at the positive comparator input is coupled to $V_{REF}$ during a given conversion test, then the corresponding capacitor in $C_{INi}$ in input array 201b at the negative comparator input simultaneously is coupled to GND, and vice versa.

During the sampling phase, all input capacitors $C_{INPi}$ and $C_{INNi}$, as well as the termination capacitors $C_T$, are coupled to the system inputs to sample the differential analog input voltages $A_{INP}$ and $A_{INN}$. The track switches $S_{TRACK}$ are closed during sampling to couple the capacitor top plates to the input common mode voltage $V_{CMi}$.

A SAR bit cycling operation is then performed on the input capacitors $C_{INPi}$ and $C_{INNi}$, as discussed above After the SAR testing is completed the top plate voltages at the positive and negative inputs to the comparator are respectively:

$$V_{TOPP} = \frac{V_{REF}C_{INPVREF}}{C_{INTOTP}} - (A_{INP} - V_{CMI}) \tag{1}$$

where:
$C_{INTOTP}$ is the total capacitance of the input array coupled to the positive comparator input;
$C_{INPVRF}$ is the input capacitance coupled to $V_{REF}$ and the positive comparator input after the SAR bit cycling operation (the remaining capacitors $C_{INPGND}$, are coupled to ground; and $A_{INP}$ is the analog input voltage to the positive path;

$$V_{TOPN} = \frac{V_{REF}C_{INNVREF}}{C_{INTOTN}} - (A_{INN} - V_{CMI}) \tag{2}$$

where:
$C_{INTOTN}$ is the total capacitance of the input array coupled to the negative comparator input;
$C_{INNVRF}$ is the input capacitance coupled between $V_{REF}$ and the negative comparator input after the SAR bit cycling operation and is complementary to $C_{INPVRF}$ (the remaining capacitors $C_{INNGND}$ are coupled to ground).

The switch positions after conversion cycling of at least one of arrays 201a,b are then decoded to generate the digital output word. For example, if switches 202a couple the capacitors $C_M$, $C_{M-1}$ and $C_{M-2}$ of array 201a a digital respectively to $V_{REF}$, GND and $V_{REF}$, then those switch positions are decoded as 101, with capacitor $C_M$ representing the MSB, $C_{M-1}$, the next MSB and so on. The switch positions of switches 202b associated with the negative differential path correspondingly represent the complementary data.

If a single well CMOS process, for example an n-well process, track switches ($S_{TRACK}$) 302 are typically implemented by p-channel transistors. The n-wells in which these p-channel transistors sit are tied to $V_{DD}$ through a filter to prevent noise from being sampled onto the capacitor arrays during the sampling phase. The sampling bandwidth requirement limits the on-resistance $R_{ON}$ of track switches $S_{TRACK}$; ideally, $R_{ON}$ is as small as possible, although some tradeoffs must be made. For example, if large p-channel transistors are used, the resistance $R_{ON}$ can be minimized; however, larger p-channel transistors are also subject to higher junction capacitances. A higher junction capacitance in turn adds attenuation to the capacitor network and effectively increases the noise and/or the offset voltage at the comparator inputs.

Moreover, for a small values of $R_{ON}$, the transistor turn-on voltage $V_{ON}$ is typically large since:

$$R_{ON} \propto \frac{1}{(W/L)(V_{ON})}; \text{ and} \tag{3}$$

$$V_{ON} = (V_{GS} - V_{TP}) \tag{4}$$

where:
$V_{TP}$ is the p-channel transistor threshold voltage;
W is the channel width;
L is the channel length; and
$V_{GS}$ is the gate to source voltage
This sets a lower limit on $V_{CMI}$ of approximately:

$$V_{ON} = (V_{CMI} - V_{TP}) \tag{5}$$

When the n-well is tied to $V_{DD}$, as described above, back-biasing results in $V_{TP}$ being relatively large. Further, with low voltage processes $V_{CMI}$ also goes down.

The top-plate voltage on capacitors $C_{INi}$ and $C_{IPi}$ should not go above or below the supply voltage rails, $V_{DD}$ and Gnd. At the same time, the reference voltage $V_{REF}$ should be as close as possible to $V_{DD}$ to minimize noise in ADC 200. Consequently, the input sampling voltage between the differential inputs $A_{IN+}$ and $A_{IN-}$ should be between 0 volts and $V_{DD}$. This is possible only when $V_{CMI}$ is approximately $V_{DD}/2$. In a 3 volt system, for example, where the lowest value for $V_{DD}$ is approximately 2.7V, $V_{CMI}$ is therefore approximately 1.35 V. Therefore, assuming that the threshold voltage $V_{TP}$ for track switches $S_{TRACK}$ is approximately 0.7 volts, then $V_{ON}$ will be approximately 1.35 V–0.7V or 0.65 V, which is insufficient in many circuits to minimize $R_{ON}$. As 1.8 volt (0.18 u) circuits are developed, this problem of insufficient track switch turn-on voltage is only compounded.

One possible means of increasing $V_{ON}$ is by charge pumping the voltage at the track switch $S_{TRACK}$ gates below ground. However, typically switching transistors will not tolerate a gate to source voltage ($V_{GS}$) greater than about 10% of $V_{DD}$. Hence some other technique must be used to increase $V_{ON}$.

According to the principles of the present invention, the common mode voltage $V_{CMI}$ is increased to a value higher than $V_{CC}/2$ to insure that a sufficient $V_{GS}$ is available to the track switches $S_{TRACK}$. One or more additional test cycles are then added during the conversion phase to test whether $A_{IN+}$ is above or below a threshold which would cause $V_{TOPP}$ to go above $V_{DD}$ or $G_{ND}$.

Consider, for example, the case where $V_{REF}$ is approximately equal to $V_{DD}$ and the common mode voltage is set at approximately ¾ $V_{DD}$. For the input capacitor array (202a) at the positive comparator input, when the MSB is tied to $V_{REF}$ during the first step of a traditional SAR conversion phase:

$$V_{TOPP} = \frac{V_{DD}}{2} + \frac{3}{4}V_{DD} - A_{IN+} \quad (6)$$

Hence, $V_{TOPP}$ will go above the $V_{DD}$ rail so long as $A_{IN+}<¼$ $V_{DD}$. Therefore, the first step in the present SAR conversion process it undertaken to test for this condition. This can be done by testing the voltage on positive path capacitor $C_{m-1}$ (e.g. MSB–1) corresponding to the digital word 010 . . . 0 since the ratio of capacitor $C_{m-1}$ to $C_{INTOTP}$ corresponds to the ¼ bit weight. Mathematically, with capacitor $C_{m-1}$ tied to $V_{REF}$ at the start of the conversion phase:

$$V_{TOPP}=¼V_{DD}+¾V_{DD}-A_{IN+} \quad (7)$$

If $A_{IN+}>¼$ $V_{DD}$, then $0<V_{TOPP}<¾$ $V_{DD}$ and the voltage with only the ¼ weight capacitor at the positive comparator input coupled to $V_{REF}$ will be less than that at the negative comparator input. In other words, at least one of the MSB and MSB–1 bits will be a "keep". In this case, a full SAR conversion phase is initiated as discussed above, beginning with the MSB. Under these constraints, even if $A_{IN+}$ approaches $V_{DD}$, $V_{TOPP}$ will not go below ground. This scenario is illustrated in FIG. 4A which depicts the conversion of the first three bits of the digital output word (MSB, MSB–1, and MSB–2), to the arbitrarily selected exemplary value 101.

Figure 4B:
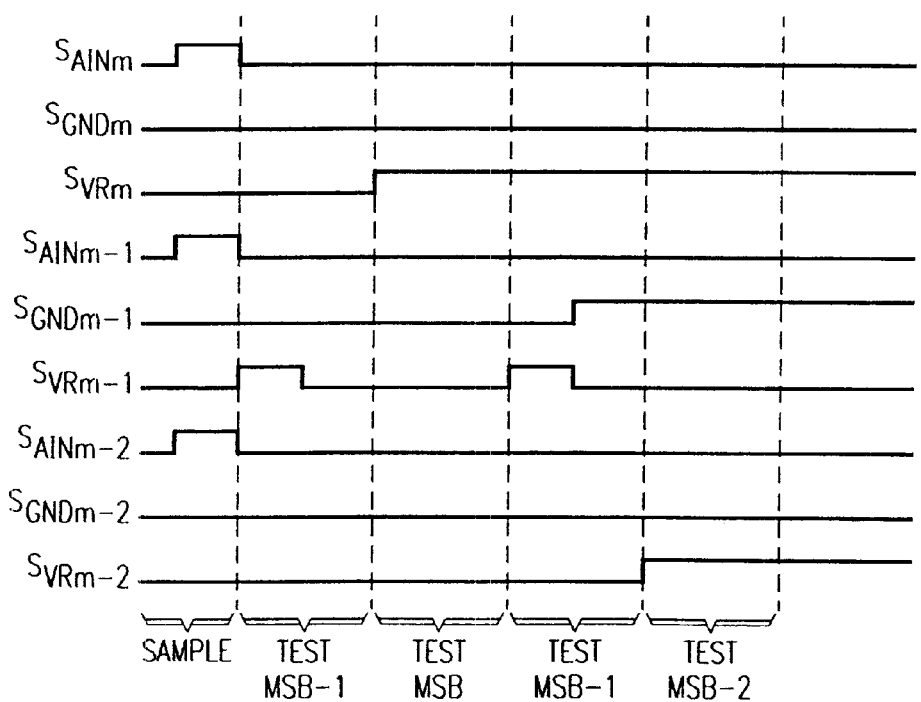

On the other the other hand, if $A_{IN+}<¼$ $V_{DD}$, then $V_{TOPP}>¾$ $V_{DD}$ and will be greater than the voltage at the negative comparator input with only the ¼ weight capacitor coupled to $V_{REF}$. In this case, at least the two most significant bits MSB and MSB–1 will be "don't keeps" and therefore coupled to ground during conversion. Hence, a SAR cycling process is not performed for these bits and instead begins with bit MSB–2. Consequently, even if $A_{IN+}$ approaches zero, $V_{TOPP}$ will not exceed $V_{DD}$. This process is shown in FIG. 4B where the first three bits MSB, MSB–1 and MSB–1 convert to 001.

At the same time, the complementary process is performed on capacitor array 201b at the negative input to comparator 203. In this case, during the extra cycle, the MSB–1 capacitor is tied to Gnd and the remaining capacitors in the negative path coupled to $V_{REF}$. If a full SAR conversion phase is required (AIN–<¾ $V_{DD}$), then the negative path MSB capacitor is coupled to Gnd and the MSB–1 capacitor is re-coupled to $V_{REF}$. On the other hand, if AIN–>¾ $V_{DD}$, the both the MSB and MSB–1 capacitors of the negative path are coupled to $V_{REF}$ and the conversion phase continues with the MSB–2 capacitor tied to ground and the remaining capacitors coupled to $V_{REF}$.

These inventive concepts can be extended to further steps in the common mode voltage $V_{CMI}$. In this case, additional test cycles are added to the conversion process. Consider as another example the case where $V_{CMI}$ is stepped by a further ⅛ $V_{DD}$ volts to ⅞ $V_{DD}$. When $V_{CMI}$ is set at ⅞ $V_{DD}$, then if $A_{IN+}<⅛$ $V_{DD}$, $V_{TOPP}$ should be >⅞ $V_{DD}$. Two test cycles are required in this case, starting with capacitor $C_{M-2}$ which corresponds to the ⅛ binary weight.

In the first additional cycle, capacitor $C_{M-2}$ is coupled to $V_{REF}$ and a comparison made (the remaining capacitors tied to Gnd). If $V_{TOPP}>⅞$ $V_{DD}$, then $A_{IN+}<⅛$ $V_{DD}$ and therefore capacitors $C_M$, $C_{M-1}$, and $C_{M-2}$ associated with the first three MSBs are coupled to ground and the SAR process continues from the fourth MSB (MSB–3). If $V_{TOPP}<⅞$ $V_{DD}$, then capacitor $C_{M-2}$ is coupled to ground and capacitor $C_{M-1}$ is coupled to $V_{REF}$ and the second comparison cycle performed. If $V_{TOPP}$ is below ¾ $V_{DD}$ ($A_{IN+}>¼$ $V_{DD}$), then a SAR conversion beginning with the MSB is initiated. Otherwise, when $V_{TOPP}>¾$ $V_{DD}$ then $A_{IN+}<¼$ $V_{DD}$ and therefore, both the capacitors associated with bits MSB and MSB–1 are coupled to ground and a SAR conversion beginning with capacitor $C_{M-2}$ (MSB–2) initiated. Again, $V_{TOPP}$ never goes above $V_{DD}$ or below Gnd.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A method of sampling an input signal in a charge redistribution circuit including a capacitor array comprising N number of capacitors, a selected capacitor M having a weight relative to a total capacitance of the array of ½M, where M is an integer from 1 to N–1, the method comprising the steps of:

setting a common mode voltage $V_{CM}$ to approximately (1–½M)$V_{DD}$, where $V_{DD}$ is a supply voltage;

coupling top plates of the plurality of capacitors of the array to the common mode voltage;

sampling an input signal onto bottom plates of the capacitors, the input signal having a voltage swing between approximately zero volts and $V_{DD}$;

coupling the bottom plate capacitor M to a high reference voltage $V_{REF}$ approximating $V_{DD}$ and the bottom plates of remaining capacitors of the array to a low reference voltage;

comparing a top plate voltage at the top plates of the capacitors against a reference voltage of ½M$V_{DD}$; and if top plate voltage is above the reference voltage of ½M$V_{DD}$, coupling capacitor M and capacitor M+1 to the low reference voltage.

2. The method of claim 1 and further comprising the step of initiating bit-cycling through the capacitor array beginning with bit M–1 by coupling capacitor M–1 to the high reference voltage and the remaining capacitors of the array to the low reference voltage.

3. The method of claim 1 and further comprising the step of initiating bit-cycling through the capacitor array beginning with bit M by coupling capacitor M to the high reference voltage and the remaining capacitors of the array to the low reference voltage.

4. The method of claim 1 wherein said step of comparing comprises the step of differentially comparing the top plate voltage at the top plates of the capacitors with a top plate voltage at top plates of capacitors of a complementary capacitor array.

5. A method of performing an analog to digital conversion in a charge redistribution circuit including a capacitor array of weighted capacitors and a transistor track switch for sampling an input signal onto the capacitor array comprising the steps of:

stepping a common mode voltage by a step to a voltage sufficient to turn-on the transistor track switch during a sampling phase;

during the sampling phase, performing the steps of:
coupling a top plate of each of the capacitors to the common mode voltage through the track switch; and
coupling a bottom plate of each of the capacitors to an input to sample an input signal; and during a conversion phase, performing the steps:
decoupling the top plate of each of the capacitors from the common mode voltage;
coupling the bottom plate of a selected one of the weighted capacitors to a first reference voltage, a weight of the selected one of the weighted capacitor proportional to the step in the common mode voltage;
coupling the bottom plates of the remaining weighted capacitors to a second reference voltage;
comparing the top plate voltage of the weighted capacitors against a comparison voltage proportional to the step in the common mode voltage; and
if the top plate voltage is above the comparison voltage, coupling the selected capacitor to the second reference voltage.

6. The method of claim 5 and further comprising the step of coupling at least one capacitor of the weighted capacitor array of a weight greater than the weight of the selected capacitor to the second reference voltage if the top plate voltage is above the comparison voltage.

7. The method of claim 5 wherein the conversion phase further comprises the steps of:

coupling a second selected capacitor of the weighted capacitor array of a weight less than the weight of the selected capacitor to the first reference voltage;

comparing the top plate voltage against a comparison voltage; and selectively coupling the second selected capacitor to one of the first and second reference voltages in response to said step of comparing.

8. The method of claim 5 wherein the comparison voltage is generated by a complementary array of weighted capacitors.

9. The method of claim 5 wherein the transistor track switch comprises a p-channel transistor and said step of stepping comprises the step of stepping the common mode voltage to provide a sufficient gate to source voltage to the p-channel transistor during the sampling phase.

10. An analog to digital converter comprising:

an array of N number of binary-weighted capacitors, a selected capacitor M having a weight relative to a total capacitance of the array of ½M, each capacitor having a top plate and a bottom plate;

a comparator having a first input coupled to said top plates of said capacitors and a second input coupled to a comparison voltage of ½M$V_{DD}$, where $V_{DD}$ is a supply voltage;

a transistor for selectively coupling the top plates of the capacitors to a common mode voltage $V_{CM}$ of approximately (1–½M)$V_{DD}$, during a input sampling phase; and a successive approximation return path coupled to an output of the comparator and operable to:
couple said bottom plates of the capacitors to an input during the sampling phase to sample an input signal having a voltage swing between approximately zero volts and $V_{DD}$;
couple said bottom plate of capacitor M to a high reference voltage $V_{REF}$ approximating $V_{DD}$ and the bottom plates of remaining capacitors of the array to a low reference voltage during a first period of a conversion phase; and
if the top plate voltage is above the reference voltage of ½M$V_{DD}$, couple capacitor M and capacitor M+1 to the low reference voltage during the second period of the conversion phase.

11. The analog to digital converter of claim 10 wherein said transistor comprises a p-channel transistor wherein the common mode voltage $V_{CM}$ of approximately (1–½M)$V_{DD}$ is set to provide sufficient source to gate voltage to turn-on said p-channel transistor during the sampling phase.

12. The analog to digital converter of claim 10 wherein the successive approximation return path is further operable to:

if the top plate voltage is below the reference voltage of ½M$V_{DD}$, couple capacitor M+1 to the high reference voltage and capacitor M to the low reference voltage during the second period of the conversion phase.

13. The analog to digital converter of claim 10 wherein the successive approximation return path is further operable to:

if the top plate voltage is above the reference voltage of ½M$V_{DD}$, coupling capacitor M–1 to the high reference voltage during the second period of the conversion phase.

14. The analog to digital converter of claim 10 wherein capacitor M+1 represents a most significant bit and capacitor M represents a second most significant bit.

15. The analog to digital converter of claim 10 wherein the reference voltage of approximately ½M$V_{DD}$ is provided by a complementary binary-weighed capacitor array coupled to said second input of said comparator.

* * * * *